United States Patent
Zweigle et al.

(10) Patent No.: US 10,148,020 B2
(45) Date of Patent: Dec. 4, 2018

(54) ELECTRICAL ASSEMBLY

(71) Applicant: Robert Bosch GmbH, Stuttgart (DE)

(72) Inventors: Peter Zweigle, Ditzingen (DE); Franco Zeleny, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/105,770

(22) PCT Filed: Nov. 6, 2014

(86) PCT No.: PCT/EP2014/073895
§ 371 (c)(1),
(2) Date: Jun. 17, 2016

(87) PCT Pub. No.: WO2015/090718
PCT Pub. Date: Jun. 25, 2015

(65) Prior Publication Data
US 2016/0315401 A1 Oct. 27, 2016

(30) Foreign Application Priority Data
Dec. 17, 2013 (DE) .................. 10 2013 226 236

(51) Int. Cl.
*H01R 4/70* (2006.01)
*H01R 4/02* (2006.01)
(Continued)

(52) U.S. Cl.
CPC ............ *H01R 4/70* (2013.01); *H01L 23/495* (2013.01); *H01R 4/02* (2013.01); *H01R 13/5216* (2013.01); *H01R 9/226* (2013.01)

(58) Field of Classification Search
CPC ........... H01R 4/70; H01L 23/495; H05K 1/14
See application file for complete search history.

(56) References Cited

U.S. PATENT DOCUMENTS 5,948,991 A * 9/1999 Nomura ............ B29C 45/14639
438/53
5,948,994 A 9/1999 Jen et al.
(Continued)

FOREIGN PATENT DOCUMENTS

CN 201118047 Y 9/2008
DE 199 12 834 A1 9/1999
(Continued)

OTHER PUBLICATIONS

International Search Report corresponding to PCT Application No. PCT/EP2014/073895, dated Feb. 6, 2015 (German and English language document) (7 pages).

*Primary Examiner* — James Wu
*Assistant Examiner* — Michael Matey
(74) *Attorney, Agent, or Firm* — Maginot, Moore & Beck LLP

(57) ABSTRACT

An electrical assembly includes a first electrical component with a first conductor, a second electrical component with a second conductor, and an accommodating chamber which is formed on the electrical assembly and in which an electrical contact point between the first and second conductors is arranged. The first conductor is arranged in a first insulating part and has at a free conductor end that protrudes from the first insulating part. The second conductor is arranged in a second insulating part and has a free conductor end that protrudes from the second insulating part. The accommodating chamber is partially filled with a potting mass such that the contact point and the free conductor ends are covered by the potting mass and the potting mass is bounded by an inner wall of the accommodating chamber. The inner wall of the accommodating chamber is formed by wall surfaces of the insulating parts.

9 Claims, 3 Drawing Sheets

(51) Int. Cl.
*H01L 23/495* (2006.01)
*H05K 1/14* (2006.01)
*H01R 13/52* (2006.01)
*H01R 9/22* (2006.01)

(56) References Cited

U.S. PATENT DOCUMENTS

| | | | |
|---|---|---|---|
| 6,188,583 B1* | 2/2001 | Fendt | H05K 1/142 361/752 |
| 6,835,090 B1* | 12/2004 | Liedtke | H01R 13/5216 439/276 |
| 7,603,908 B2* | 10/2009 | Asada | G01L 19/0084 73/700 |
| 7,690,262 B2* | 4/2010 | Nakabayashi | G01K 1/18 73/708 |
| 7,791,891 B2* | 9/2010 | Ohl | H05K 5/0078 361/728 |
| 8,028,584 B2* | 10/2011 | Otsuka | G01L 19/0069 73/706 |
| 9,306,255 B1* | 4/2016 | Rollin | H01P 3/06 |
| 2008/0005773 A1 | 1/2008 | Ikeda | |
| 2008/0216580 A1* | 9/2008 | Kuznia | G01L 19/0092 73/714 |
| 2010/0155489 A1* | 6/2010 | Chang | G06K 19/07743 235/486 |
| 2010/0159748 A1* | 6/2010 | Chang | H01R 13/6658 439/620.22 |
| 2011/0139802 A1* | 6/2011 | Takahata | H01L 23/293 220/729 |
| 2011/0223811 A1* | 9/2011 | Hsueh | H01R 9/03 439/629 |
| 2013/0000972 A1 | 1/2013 | Yoshikawa et al. | |
| 2014/0341255 A1* | 11/2014 | Kaiser | G01K 13/02 374/143 |
| 2015/0158221 A1* | 6/2015 | Izumi | B29C 45/1671 361/679.01 |
| 2016/0172134 A1* | 6/2016 | Watari | F02N 11/087 361/820 |
| 2016/0294035 A1* | 10/2016 | Rollin | H01P 3/06 |

FOREIGN PATENT DOCUMENTS

| | | |
|---|---|---|
| EP | 0 591 631 A1 | 4/1994 |
| EP | 0 999 601 A1 | 5/2000 |
| FR | 2 605 145 A1 | 4/1988 |
| WO | 93/12636 A1 | 6/1993 |

* cited by examiner

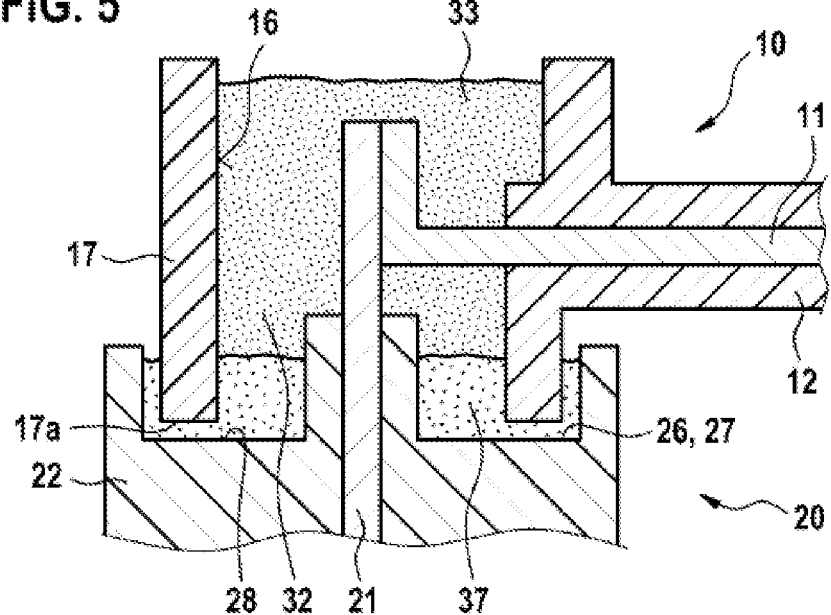
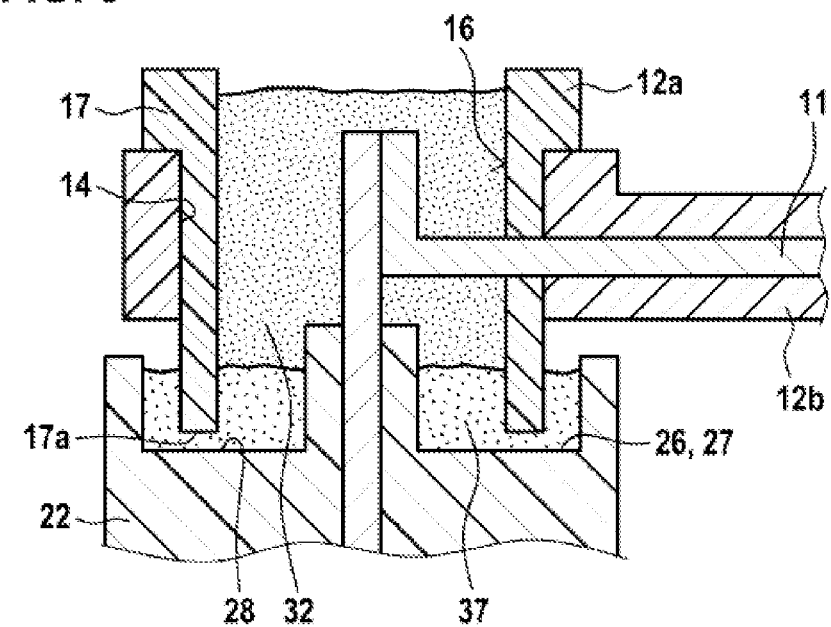

ELECTRICAL ASSEMBLY

This application is a 35 U.S.C. § 371 National Stage Application of PCT/EP2014/073895, filed on Nov. 6, 2014, which claims the benefit of priority to Serial No. DE 10 2013 226 236.1, filed on Dec. 17, 2013 in Germany, the disclosures of which are incorporated herein by reference in their entirety.

BACKGROUND

The disclosure relates to an electrical assembly.

Electronic control modules that can be arranged on the transmission and in the transmission fluid are used for controlling the transmission in automotive engineering. The control modules can comprise by way of example electrical assemblies such as plug connectors, sensors, actuators, at least one encapsulated control unit (TCU, Transmission Control Unit) and where necessary further components that are fastened to a central carrier and are exposed to the transmission fluid. When components are arranged in the transmission fluid, this places high demands on the technology involved in assembling and connecting the components on the carrier of the electronic control module since the electrical connections must be able to withstand high loadings as a result of temperature changes and withstand transmission fluid that in the worst case scenario contains metal chips. Insert molded lead frames and also rigid circuit boards or flexible circuit boards (so-called flex-foils, FPC) are used in the prior art as carriers in the electrical connection technology.

Insert molded lead frames that comprise metal conductors that are encased by an insulating part that is produced from injection molding represent a particularly robust and tried and tested solution. Free conductor ends of the conductors that are removed from the insulation of the injection molding compound are electrically contacted by male connectors, sensors, actuators or other electrical components of the control module. These electrical components comprise a dedicated component-insulating part, by way of example a sensor housing, and are provided with dedicated electrical conductors. The free conductor ends of these conductors protrude in the form of connection contacts out of the component-insulating part and are electrically connected by means of welding or soldering to the free conductor ends of the electrical conductors of the insert molded lead frame.

The contact site must be protected against aggressive substances and metal chips that are contained in the transmission oil. It is known to arrange the contact site in a receiving chamber that is formed on the insert molded lead frame and is filled with a casting compound after the electrical contact has been produced, in other words by way of example after the free conductor ends have been welded. The potting compound is introduced into the receiving chamber through an open side and by way of example hardens. In order to prevent the potting compound from escaping prior to it hardening, the receiving chamber is embodied as a bath-shaped depression that is closed on at least five sides. A relatively large amount of installation space is required in order to provide a bath-shaped receiving chamber of this type in the insert molded lead frame part so that the carrier of the electronic control module has a specific thickness which is disadvantageous as a result of the higher material costs and the installation situation on the transmission.

SUMMARY

It is proposed in accordance with the disclosure that the receiving chamber comprises an internal wall that is formed by means of wall surfaces both of the first insulating part and also a second insulating part. The first insulating part can be by way of example the injection molding insulation of a lead frame part of a carrier used in the technology of assembling and connecting an electronic control module. The second insulating part can be by way of example a sensor housing, plug connector housing or the housing of any other electrical component (by way of example an actuator) and can comprise electrical connecting conductors, the free conductor ends of which are connected to the conductors of the insert molded lead frame part.

By means of the solution in accordance with the disclosure, the receiving chamber is produced for the potting compound only when the first insulating part is arranged on the second insulating part. The receiving chamber is sealed in a leak-proof manner on at least five sides so that it is not possible for the potting compound to escape. Since the inner wall of the receiving chamber is formed by means of wall surfaces both of the first insulating part and also of the second insulating part, the installation space that is required so as to arrange the receiving chamber in each of the two electrical components can be kept in an advantageous manner relatively small. In particular, it is possible to reduce the amount of installation height required on the first electrical component (by way of example an insert molded lead frame), since only some and not all wall surfaces of the receiving chamber are integrated in the insert molded lead frame. The handling procedure during the process of producing the electrical assembly is facilitated and the contact site between the electrical conductors that are to be connected is more easily accessible.

Advantageous embodiments and further developments of the disclosure are rendered possible by means of the features disclosed in the dependent claims.

Particularly advantageous is one exemplary embodiment in which the first insulating part comprises a frame, wherein the frame forms a circumferential wall surface that delimits the receiving chamber at the sides and is arranged on the second insulating part in such a manner that a wall surface of the second insulating part forms a base of the receiving chamber that seals the frame on one side. The first insulating part can be advantageously designed in a relatively planar manner since the base of the receiving chamber for the potting compound is formed by means of a second insulating part, by way of example a sensor housing.

The first insulating part can be embodied as one-piece. However, it is advantageously also possible that the first insulating part is embodied as a multi-piece and comprises at least one frame part and also at least one carrier part to which the frame part is fixed. The frame part can by way of example form a part or the entire wall surface that delimits the receiving chamber at the sides. The frame part can be manufactured advantageously separate from the carrier part and subsequently can be connected in a sealed manner to the carrier part so that a compound structure is formed that represents the first insulating part and comprises a complete frame. The process of manufacturing the first insulating part is consequently facilitated since by way of example it is not necessary to produce complicated molds in the injection molding tool, but rather both the frame part and also the carrier part can each comprise a quite simple construction.

In an advantageous manner, the free conductor end of the second conductor can protrude in a perpendicular manner out of the base into the receiving chamber or the free conductor end of the first conductor can protrude from the circumferential wall surface into the receiving chamber. This facilitates the production of an electrical contact site between the free conductor ends that can be performed by way of example by means of welding. Advantageously, the free conductor end of the first conductor can be bent over at its outermost section parallel to the free conductor end of the second conductor and by way of example can be welded thereto to form the contact site.

In order to produce a receiving chamber that is sealed on five sides, it is advantageous if the first insulating part comprises a frame that is arranged on the second insulating part by means of interpositioning a sealing material. The sealing material can form by way of example a circumferential seal. The seal can be represented by way of example by an elastomer ring (O-ring) or an elastomer seal that is sprayed onto the first insulating part or onto the second insulating part in the contact region of the first insulating part and the second insulating part. A further exemplary embodiment provides that the seal is formed by means of being further injection molded with a sealing material that is introduced as a circumferential seal into a recess that is formed on a wall surface of the second insulating part, said wall surface forming the base of the receiving chamber, or on an end face of the frame, said end frame facing the second insulating part.

BRIEF DESCRIPTION OF THE DRAWINGS

In the drawings:

FIG. 5 illustrates a fifth exemplary embodiment of the disclosure, and FIG. 6 illustrates a sixth exemplary embodiment of the disclosure.

DETAILED DESCRIPTION

Figure 1:
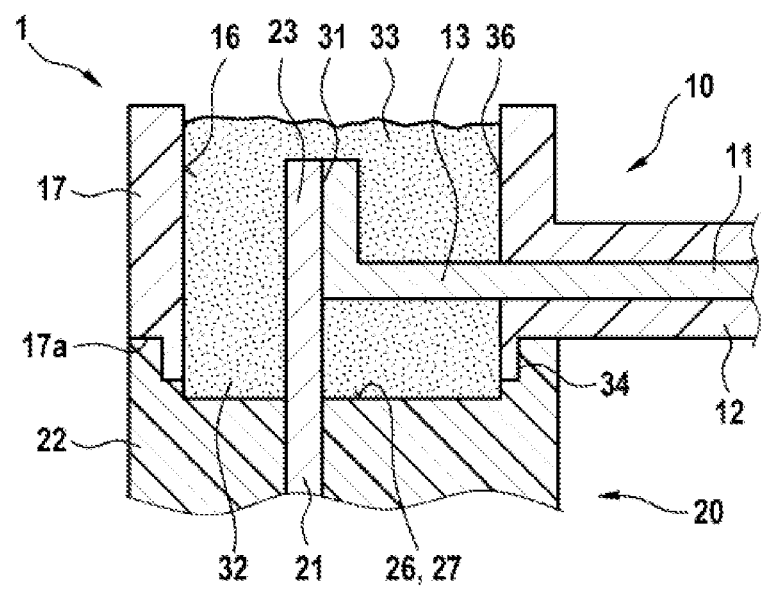
FIG. 1 illustrates a first exemplary embodiment of the disclosure.

FIG. 1 illustrates a sectional view of an electrical assembly 1. The electrical assembly can be by way of example an electrical or electronic control unit or control module of a transmission control. The electrical assembly comprises a first electrical component 10 that is by way of example an insert molded part. The lead frame part comprises multiple strip-shaped metal conductors that are insert molded with an insulating compound that forms a first insulating part 12. The sectional view in FIG. 1 illustrates a first conductor 11 that is arranged in a first insulating part 12. In the context of the present application, the term 'conductor' is understood to mean an electrical conductor. As is easily evident in FIG. 1, the first insulating part 12 comprises a frame 17 that is embodied in one-piece on the insulating part and said frame forms a circumferential wall surface 16 that delimits at the sides a receiving chamber 32 for receiving an injection molding compound 33. The wall surface 16 can have a cross-section that is rectangular, circular or any other shape. The frame 17 comprises two opposite-lying openings, one of which is sealed by the second insulating part 22 and the other one of which is used for introducing the potting compound 33. A free conductor end 13 of the first conductor 11 protrudes from the circumferential wall surface 16 of the frame 17 in a perpendicular manner into the receiving chamber 32. The first conductor end 13 is bent at its outermost section by way of example in a perpendicular manner.

A second electrical component 20 is produced independently from the first electrical component 10. The second electrical component 20 is by way of example a sensor, plug connector or actuator. The second electrical component 20 can also be an insert molded lead frame part. Only the electrical connection section of the second electrical component 20 is illustrated in FIG. 1. The second electrical component 20 can comprise multiple electrical conductors, of which only a second conductor 21 is evident in FIG. 1. The second conductor 21 is embedded in a second insulating part 22 and is electrically connected at its conductor end, not illustrated, to a sensor element. The other free conductor end 23 of the conductor 21 protrudes in a perpendicular manner from a wall surface 26 into the receiving chamber 32.

The first electrical component 10 and the second electrical component 20 are connected one to the other in a mechanical manner. This is achieved by way of example in that the first insulating part 12 is placed together with the frame 17 on the second insulating part 22 of the second electrical component 20. An end face 17a of the frame 17 contacts the second insulating part 22 in the region of the reference numeral 34. This can be achieved by way of example by means of a press-fitting arrangement in the region of the reference numeral 34. The frame 17 can comprise at its end face 17a a stepped arrangement that engages in a complementarily shaped collar of the second insulating part 22 to form a sealing labyrinth. The synthetic material can also be melted on at this site so as to provide a seal.

The compound structure comprising the first electrical component 10 and the second electrical component 20 forms a receiving chamber 32 that is embodied in a closed manner on at least five sides and preferably on precisely five sides. Four sides are formed by means of the circumferential wall surface 16 of the frame 17 of the first insulating part 12 and the fifth side is formed by means of a wall surface 26 of the second insulating part 22, said wall surface 26 representing simultaneously the base 27 of the receiving chamber 32. The receiving chamber 32 therefore comprises an inner wall 36 that is closed on five sides and is filled with a potting compound 33. During the process of introducing the potting compound 33, said compound is introduced through the open upper face of the frame 17 and by way of example subsequently hardens. It is evident in FIG. 1 that the free conductor end 13 of the first conductor 11 is bent at its outermost section parallel to the free conductor end of the second conductor 21 and is electrically connected to said free conductor end 23 by way of example by means of welding to form the contact site 31. The potting compound 33 covers the contact site 31 and the free conductor ends 13 and 23 of the first conductor 11 and the second conductor 21.

Figure 2:
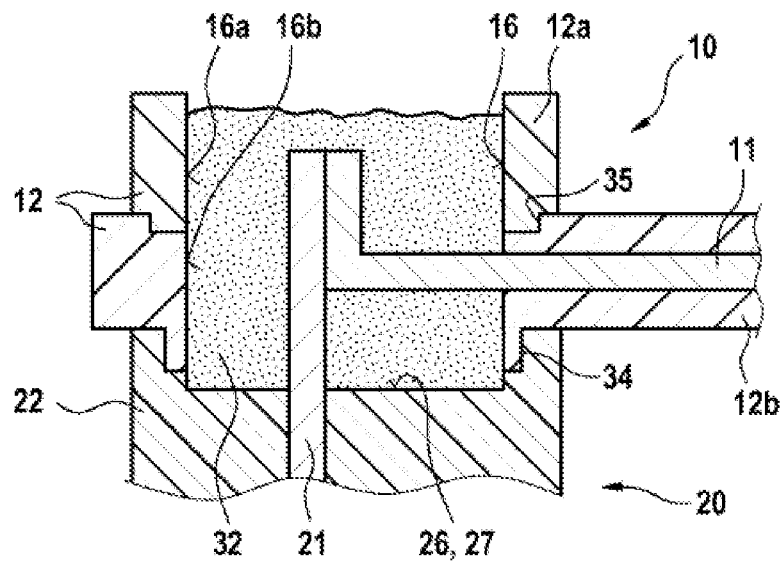
FIG. 2 illustrates a second exemplary embodiment of the disclosure.

A second exemplary embodiment is illustrated in FIG. 2. This exemplary embodiment differs from the first exemplary embodiment by virtue of the fact that the first insulating part 12 is embodied in two pieces and comprises a carrier part 12b and a frame part 12a arranged on said carrier part. The carrier part 12b is embodied in this case in a particularly planar manner and comprises a wall section 16b that together with a wall section 16a of the frame part 12a forms the circumferential wall surface 16 of the receiving chamber 32. The frame part 12 can be fixed to the carrier part 12b in the region of the reference numeral 35 by means of a press-fitting arrangement. The seal in the region of the reference number 35 can be provided in this case in a similar manner to the seal already mentioned above between the first insulating part 12 and the second insulating part 22 in the region of the reference numeral 34, in other words by way of example the seal can be provided with a step or sealing lip and can be sealed by means of a press-fitting procedure or a fusing procedure or a similar method.

Figure 3:
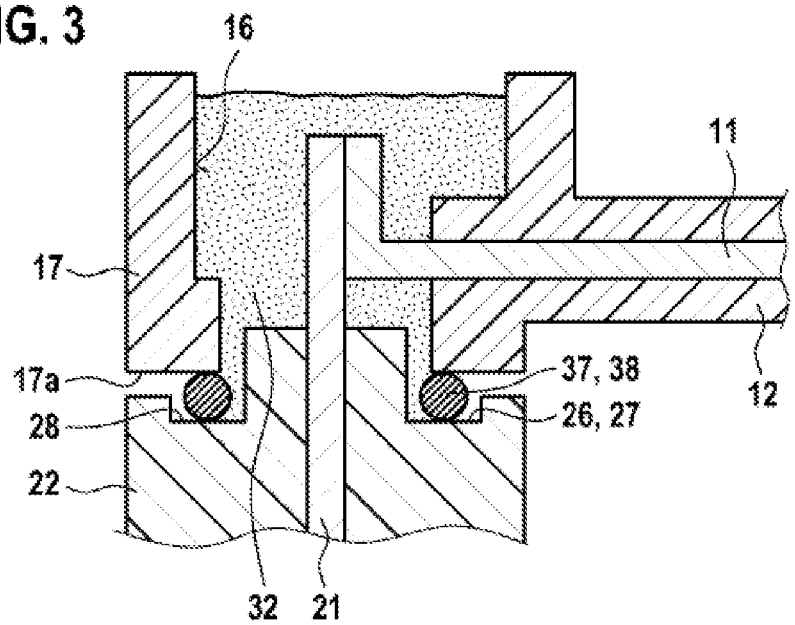
FIG. 3 illustrates a third exemplary embodiment of the disclosure.

FIG. 3 illustrates a third exemplary embodiment. In the case of this exemplary embodiment, the first insulating part 12 is also embodied as one-piece. The frame 17 that is embodied on the first insulating part 11 comprises an end face 17a that faces the second insulating part 22 and is placed against the wall surface 26 of the second insulating part 22 by means of interpositioning a seal 38 that is embodied by way of example from an elastomer material as a sealing material 37. The seal can be formed by way of example by an O-ring that is placed in a recess in the wall surface 26 or in the end face 17a (not illustrated). The recess 28 can be embodied as a circumferential groove.

Figure 4:
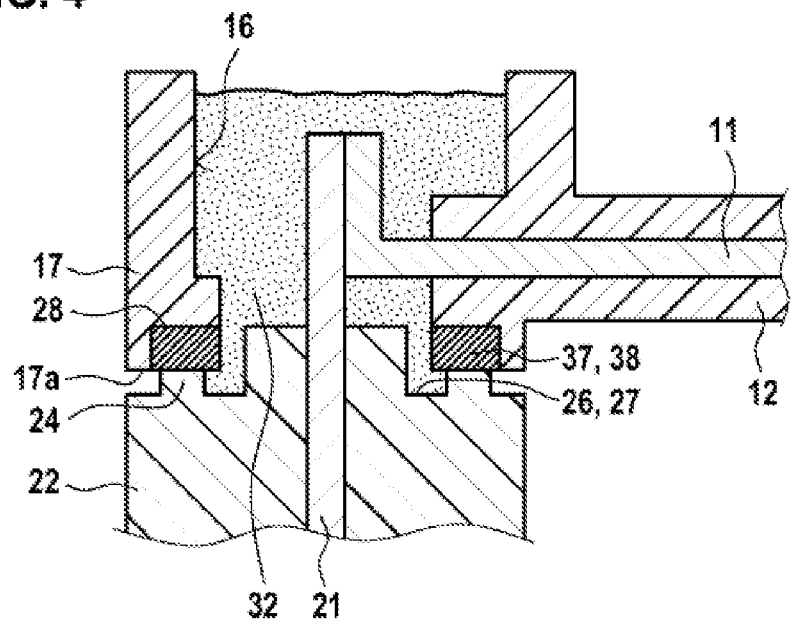
FIG. 4 illustrates a fourth exemplary embodiment of the disclosure.

In the case of a further exemplary embodiment that is illustrated in FIG. 4, the frame 17 is provided on its face facing the second insulating part 22 with a recess 28 and a circumferential seal 38 that is embodied from a sealing material 37, by way of example an elastomer, is injected into said recess. The sealing material would in other words be sprayed onto the end face 17a in the region of the recess 28. The wall surface 26 of the second insulating part 22 comprises a collar 24 that is pressed against the seal 38.

FIG. 5 illustrates a further exemplary embodiment. In the case of this exemplary embodiment, the first insulating part 11 is also embodied as one-piece and comprises a frame 17 that is embodied therewith as one-piece. The second insulating part 22 is provided on its face facing the first insulating part 11 with a circumferential recess 28 that forms by way of example an annular groove. The recess 28 is filled with a sealing material 37. The sealing material 37 can be of an identical material to the potting compound 33 that fills the receiving chamber 32. The frame 17 is immersed with its circumferential end face 17a into the sealing material 37. This is expediently performed prior to introducing the potting compound 33 and after the free conductor ends 13, 23 have been welded one to the other. A receiving chamber 32 that is sealed on five sides is also produced in this case and the inner wall of said receiving chamber is formed by means of the circumferential wall surface 16 of the frame 17 and by means of the wall surface 26 of the second insulating part 22, said wall surface 26 forming the base 27 and being covered in part with the sealing material 37.

FIG. 6 illustrates a further exemplary embodiment. In the case of this exemplary embodiment, the first insulating part 12 is also embodied in two pieces with a carrier part 12b and a frame part 12a. In contrast to FIG. 2, the frame part 12a in this case forms the entire circumferential wall 16 of the receiving chamber 32. The frame part 12a is embodied in a sleeve-shaped manner from an insulating material, wherein the first conductor 11 is inserted through the wall of the frame part 12a in a sealing manner. The carrier part 12b comprises an opening through which the sleeve-shaped frame part 12a extends. In a similar manner to that in FIG. 5, the frame part 12a forms a frame 17 whose end face 17a immerses into the sealing material 37 that is arranged in a circumferential recess 28 in the wall surface 27 of the second insulating part 22.

It goes without saying that further exemplary embodiments are possible that develop as combinations of the illustrated embodiments. Modifications are also possible. By way of example, the first insulating part can comprise three or more parts or the second insulating part can be embodied as a multi-piece. Likewise, exemplary embodiments are possible that have conductor ends that are bent in a different manner. It is also possible to arrange multiple conductor ends of multiple first conductors and multiple second conductors together in a receiving chamber and for said conductor ends to be contacted there in each case in pairs. The electrical contact site between the conductor ends can also be produced by means of a soldering method, adhesive bonding method, welding method, laser welding method, insulation-displacement connection method or using any other method. The disclosure is not limited to use in electrical control modules for controlling the transmission and can also be used in other electrical assemblies.

The invention claimed is:

1. An electrical assembly, comprising:
   a first electrical component that comprises a first insulating part and at least one first conductor arranged in the first insulating part, the at least one first conductor having at least one first free conductor end that protrudes from a first wall of the first insulating part;
   a second electrical component that is formed independently from the first electrical component and comprises a second insulating part and at least one second conductor arranged in the second insulating part, the at least one second conductor having at least one second free conductor end that protrudes from a second wall of the second insulating part so as to be spaced apart from the second insulating part, the first and second walls at least partially defining a receiving chamber; and
   an electrical contact site at which the first conductor and the second conductor contact one another, and which is arranged in the receiving chamber, the receiving chamber filled at least in part with a first potting compound, which is separate from the first and second insulating parts, such that (i) except at the electrical contact site, the at least one first and at least one second free conductor ends are completely surrounded by the first potting compound and (ii) the first potting compound is delimited on at least five sides by an inner wall of the receiving chamber,
   wherein:
      the inner wall of the receiving chamber is defined by a plurality of wall surfaces of both the first insulating part and the second insulating part, the plurality of wall surfaces including the first wall and the second wall;
      the first electrical component is formed by a metal lead frame part that is encased at least in sections by an injection molding compound that forms the first insulating part and the second electrical component is formed by a metal lead frame part that is encased at least in sections by a second potting compound that forms the second insulating part;
      the first insulating part includes a frame that forms a circumferential wall surface that delimits outer circumferential sides of the receiving chamber; and
      the frame is arranged on the second insulating part in such a way that the second wall surface of the second insulating part forms a base of the receiving chamber that seals against the circumferential wall surface so as to close the frame on one side.

2. The electrical assembly as claimed in claim 1, wherein the first insulating part is configured in multiple pieces, the first insulating part including at least one carrier part and at least one frame part that is fixed to the carrier part.

3. The electrical assembly as claimed in claim 1, wherein the second free conductor end protrudes in a perpendicular manner out of the base into the receiving chamber.

4. The electrical assembly as claimed in claim 1, wherein the first free conductor end protrudes from the circumferential wall surface into the receiving chamber.

5. The electrical assembly as claimed in claim 3, wherein the first free conductor end has an outermost section that is bent parallel to the second free conductor end and is electrically connected to the second free conductor end to form the electrical contact site.

6. The electrical assembly as claimed in claim 1, wherein a sealing material is interposed between the frame and the second insulating part, the sealing material being different from the first potting compound.

7. The electrical assembly as claimed in claim 6, wherein the sealing material forms a circumferential seal.

8. The electrical assembly as claimed in claim 7, wherein the circumferential seal is introduced into a recess that is formed at the base or at an end face of the frame, the end face facing the second insulating part.

9. The electrical assembly as claimed in claim 5, wherein the first free conductor end is welded to the second free conductor end to form the electrical contact site.

\* \* \* \* \*